United States Patent
El-Hinnawy et al.

(10) Patent No.: US 11,050,022 B2
(45) Date of Patent: Jun. 29, 2021

(54) RADIO FREQUENCY (RF) SWITCHES HAVING PHASE-CHANGE MATERIAL (PCM) AND HEAT MANAGEMENT FOR INCREASED MANUFACTURABILITY AND PERFORMANCE

(71) Applicant: Newport Fab, LLC, Newport Beach, CA (US)

(72) Inventors: Nabil El-Hinnawy, Irvine, CA (US); Gregory P. Slovin, Irvine, CA (US); Jefferson E. Rose, Hawthorne, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 86 days.

(21) Appl. No.: 16/247,156

(22) Filed: Jan. 14, 2019

(65) Prior Publication Data

US 2020/0058864 A1 Feb. 20, 2020

Related U.S. Application Data

(63) Continuation-in-part of application No. 16/173,340, filed on Oct. 29, 2018, now Pat. No. 10,916,540, and (Continued)

(51) Int. Cl.
*H01L 45/00* (2006.01)
*H01L 23/66* (2006.01)

(52) U.S. Cl.
CPC .......... *H01L 45/1286* (2013.01); *H01L 23/66* (2013.01); *H01L 45/06* (2013.01);
(Continued)

(58) Field of Classification Search
CPC ..... H01L 45/1286; H01L 45/06; H01L 23/66; H01L 45/126; H01L 45/144; H01L 45/1226
(Continued)

(56) References Cited

U.S. PATENT DOCUMENTS 5,976,932 A 11/1999 Kerber
6,448,576 B1 9/2002 Davis
(Continued)

FOREIGN PATENT DOCUMENTS

WO WO 2016/028362 2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.
(Continued)

*Primary Examiner* — Michael Jung
(74) *Attorney, Agent, or Firm* — Farjami & Farjami LLP

(57) ABSTRACT

A radio frequency (RF) switch includes a heating element and a thermally resistive material adjacent to sides of the heating element. A thermally conductive and electrically insulating material is situated on top of the heating element. A phase-change material (PCM) is situated over the thermally conductive and electrically insulating material. The PCM has an active segment overlying the thermally conductive and electrically insulating material, and passive segments underlying input/output contacts of the RF switch. The RF switch may include a bulk substrate heat spreader, a silicon-on-insulator (SOI) handle wafer heat spreader, or an SOI top semiconductor heat spreader under the heating element.

20 Claims, 9 Drawing Sheets

Related U.S. Application Data a continuation-in-part of application No. 16/103,646, filed on Aug. 14, 2018, now Pat. No. 10,475,993, and a continuation-in-part of application No. 16/103,587, filed on Aug. 14, 2018, now Pat. No. 10,461,253, and a continuation-in-part of application No. 16/103,490, filed on Aug. 14, 2018, now Pat. No. 10,476,001.

(52) U.S. Cl.
CPC ........ *H01L 45/126* (2013.01); *H01L 45/1226* (2013.01); *H01L 45/144* (2013.01)

(58) Field of Classification Search
USPC ................................ 257/1–5; 365/148, 163
See application file for complete search history.

(56) References Cited

U.S. PATENT DOCUMENTS

| | | |
|---|---|---|
| 6,535,545 B1 | 1/2003 | Ben-Bassat |
| 7,522,029 B1 | 4/2009 | Lantz |
| 7,761,067 B1 | 7/2010 | Tsai et al. |
| 8,314,983 B2 | 11/2012 | Frank |
| 2,014,181 A1 | 7/2014 | Moon |
| 9,257,647 B2 | 2/2016 | Borodulin |
| 9,362,492 B2 | 6/2016 | Goktepeli |
| 9,368,720 B1 | 6/2016 | Moon et al. |
| 9,444,430 B1 | 9/2016 | Abdo |
| 9,601,545 B1 | 3/2017 | Tu |
| 9,640,759 B1 | 5/2017 | Curioni |
| 9,891,112 B1 | 2/2018 | Abel |
| 9,917,104 B1 | 3/2018 | Roizin |
| 10,128,243 B2 | 11/2018 | Yoo |
| 10,164,608 B2 | 12/2018 | Belot |
| 10,461,253 B1 | 10/2019 | Slovin |
| 10,505,106 B1 | 12/2019 | Joshi |
| 10,529,922 B1 | 1/2020 | Howard |
| 2004/0113232 A1 | 6/2004 | Johnson et al. |
| 2005/0127348 A1 | 6/2005 | Horak |
| 2005/0212090 A1 | 9/2005 | Friedrich et al. |
| 2006/0246712 A1 | 11/2006 | Kim |
| 2007/0075347 A1 | 4/2007 | Lai |
| 2007/0099405 A1 | 5/2007 | Oliva et al. |
| 2007/0246766 A1* | 10/2007 | Liu ........................ H01L 45/06 257/314 |
| 2008/0042243 A1 | 2/2008 | Lee et al. |
| 2008/0142775 A1 | 6/2008 | Chen |
| 2008/0142777 A1 | 6/2008 | Park |
| 2008/0272355 A1 | 11/2008 | Cho |
| 2008/0291718 A1* | 11/2008 | Liu ..................... H01L 45/1233 365/163 |
| 2009/0065761 A1* | 3/2009 | Chen .................... H01L 45/144 257/5 |
| 2009/0115052 A1* | 5/2009 | Treece ................ H01L 21/8258 257/706 |
| 2010/0084626 A1 | 4/2010 | Delhougne |
| 2010/0238603 A1 | 9/2010 | Chung |
| 2010/0238720 A1 | 9/2010 | Tio Castro |
| 2010/0246247 A1 | 9/2010 | Kim |
| 2011/0097825 A1 | 4/2011 | Cheng |
| 2011/0291784 A1 | 12/2011 | Nakatsuji |
| 2012/0037872 A1* | 2/2012 | Ikarashi ............. G11C 13/0007 257/2 |
| 2013/0187120 A1 | 7/2013 | Redaelli |
| 2013/0285000 A1 | 10/2013 | Arai |
| 2014/0110657 A1 | 4/2014 | Redaelli |
| 2014/0191181 A1 | 7/2014 | Moon |
| 2014/0264230 A1 | 9/2014 | Borodulin |
| 2014/0339610 A1 | 11/2014 | Rashed |
| 2015/0048424 A1 | 2/2015 | Tien |
| 2015/0090949 A1 | 4/2015 | Chang |
| 2015/0104921 A1 | 4/2015 | Terai et al. |
| 2015/0333131 A1 | 11/2015 | Mojumder |
| 2016/0035973 A1 | 2/2016 | Raieszadeh |
| 2016/0056373 A1* | 2/2016 | Goktepeli ............. H01L 45/126 257/2 |
| 2016/0071653 A1 | 3/2016 | Lamorey |
| 2016/0300612 A1 | 10/2016 | Manipatruni et al. |
| 2016/0308507 A1 | 10/2016 | Engelen |
| 2017/0092694 A1 | 3/2017 | BrightSky |
| 2017/0126205 A1 | 5/2017 | Lin |
| 2017/0187347 A1 | 6/2017 | Rinaldi |
| 2017/0207764 A1 | 7/2017 | Wang |
| 2017/0243861 A1 | 8/2017 | Wang |
| 2017/0365427 A1 | 12/2017 | Borodulin |
| 2018/0005786 A1 | 1/2018 | Navarro |
| 2018/0138894 A1 | 5/2018 | Belot |
| 2018/0194615 A1 | 7/2018 | Nawaz |
| 2018/0266974 A1 | 9/2018 | Khosravani |
| 2018/0269393 A1 | 9/2018 | Zhang |
| 2019/0064555 A1 | 2/2019 | Hosseini |
| 2019/0067572 A1 | 2/2019 | Tsai |
| 2019/0088721 A1 | 3/2019 | Reig |
| 2019/0165264 A1 | 5/2019 | Wu |
| 2019/0172657 A1 | 6/2019 | Zhu |
| 2019/0267214 A1 | 8/2019 | Liu |
| 2019/0296718 A1 | 9/2019 | Birkbeck |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

\* cited by examiner

US 11,050,022 B2

RADIO FREQUENCY (RF) SWITCHES HAVING PHASE-CHANGE MATERIAL (PCM) AND HEAT MANAGEMENT FOR INCREASED MANUFACTURABILITY AND PERFORMANCE

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch. Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/173,340 filed on Oct. 29, 2018, titled "Device Including PCM RF Switch Integrated with Group III-V Semiconductors,". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds. This presents a particular challenge for switching devices to prevent degradation due to high thermal energy while achieving fast switching times. Conventional PCM switches may fail to heat or cool fast enough for certain applications. Moreover, neighboring and sensitive semiconductor structures and components may be undesirably heated or suffer consequences from thermal cycling.

Accordingly, accommodating phase-change materials in RF switches can present significant design challenges, and there is need for proper heating and cooling of the phase-change materials in PCM RF switches for achieving the desired crystalline phase and amorphous phase transformations while maintaining reliable PCM RF switches.

SUMMARY

The present disclosure is directed to heat management for increased manufacturability and performance of phase-change material (PCM) radio frequency (RF) switches, substantially as shown in and/or described in connection with at least one of the figures, and as set forth in the claims.

DETAILED DESCRIPTION

Figure 1:
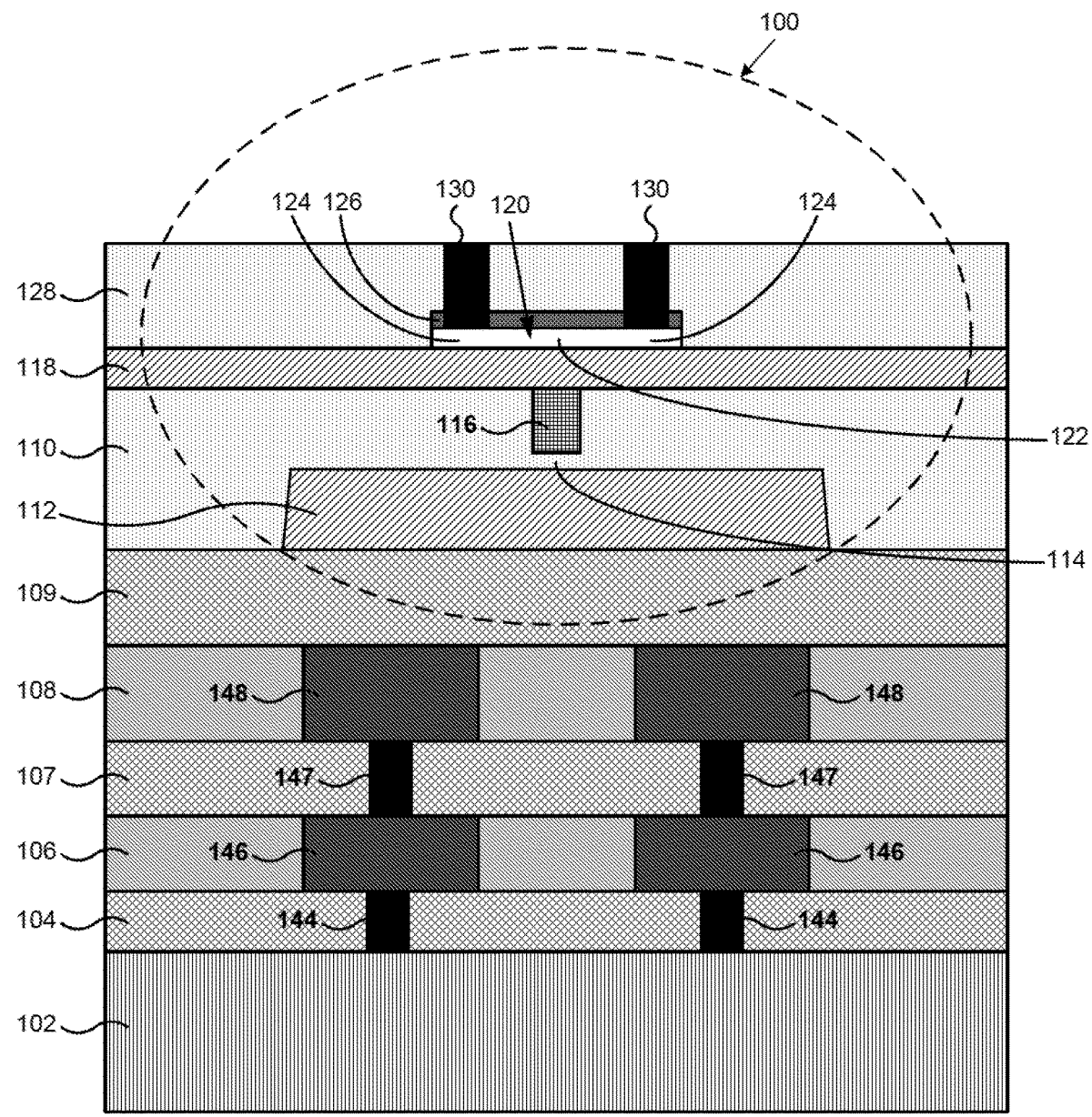
FIG. 1 illustrates a portion of an exemplary phase-change material (PCM) radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a portion of an exemplary phase-change material (PCM) radio frequency (RF) switch according to one implementation of the present application. The semiconductor structure of FIG. 1 shows PCM RF switch 100 as circumscribed by dashed oval-shaped enclosure 100. RF switch 100 is shown as including heat spreader 112, thermally resistive material 110, heat valve 114, heating element 116, thermally conductive and electrically insulating material 118, PCM 120 having active segment 122 and passive segments 124, optional contact uniformity support layer 126, contact dielectric 128, and input output contacts 130. In addition to RF switch 100, the semiconductor structure of FIG. 1 shows bulk substrate 102, pre-metal dielectric 104, interlayer metal levels 106 and 108, interlayer dielectrics 107 and 109, exemplary grounding contacts 144, and exemplary metal segments 146 and 148, and exemplary vias 147.

Bulk substrate 102 is situated below pre-metal dielectric 104. In various implementations, bulk substrate 102 is a silicon (Si), germanium (Ge), silicon germanium (SiGe), silicon carbide (SiC), group III-V or sapphire substrate. Pre-metal dielectric 101 is situated on top of bulk substrate 102. Pre-metal dielectric 104 aids formation and processing of grounding contacts 144 and metal segments 146 in a multi-level metallization. In various implementations, pie-metal dielectric 104 can comprise borophosphosilicate glass (BPSG), tetra-ethyl ortho-silicate (TEOS), silicon onynitride ($SiO_XN_Y$), silicon oxide ($SiO_2$), silicon nitride ($Si_XN_Y$), or another dielectric.

Interlayer metal level 106, interlayer dielectric 107, and interlayer metal level 108, and interlayer dielectric 109 are sequentially situated over pre-metal dielectric 104. Interlayer metal levels 106 and 108 provide layers in which metal segments 146 and 148 can be built. Metal segments 146 and 148 are shown in the semiconductor structure of FIG. 1 in order to provide additional context and to better illustrate that various layers can also exist in a semiconductor structure in which a PCM RF switch, such as PCM RF switch 100, may reside. For example, metal segments 146 and 148 can be part of routing interconnects for routing electrical signals between various devices (not shown in FIG. 1) that may exist independent of RF switch 100. In the present implementation, interlayer metal level 106 is the first interlayer metal level and metal segments 146 are formed in the first interlayer metal (i.e., M1). Interlayer metal level 108 is the second interlayer metal level and metal segments 148 are formed in the second interlayer metal (i.e., M2). Interlayer dielectric 107 provides insulation between interlayer metal levels 106 and 108. Pre-metal dielectric 104 and interlayer dielectric 107 provide layers in which grounding contacts 144 and vias 147 can be built. In various implementations, the semiconductor structure in FIG. 1 can include more interlayer metal levels and/or more interlayer dielectrics than those shown in FIG. 1.

Heat spreader 112 is situated over interlayer dielectric 109 in thermally resistive material 110. Heat spreader 112 generally dissipates excess heat generated by RF switch 100. In particular, heat spreader 112 dissipates excess heat generated by heating element 116 after a heat pulse, such as a crystallizing pulse or an amorphizing pulse, has transformed the state of RF switch 100 to an ON state or an OFF state. Heat spreader 112 can comprise any material with high thermal conductivity. In one implementation, heat spreader 112 can comprise a material with high thermal conductivity and high electrical resistivity. In various implementations, heat spreader 112 can comprise aluminum nitride (AlN), aluminum oxide ($Al_XO_Y$), beryllium oxide ($Be_XO_Y$), silicon carbide (SiC), diamond, or diamond-like carbon. In one implementation, the thermal conductivity of heat spreader 112 can range from approximately thirty five watts per meter-kelvin to approximately fifty watts per meter-kelvin (35 W/(m·K)- 120 W/(m·K)).

Thermally resistive material 110 is situated over interlayer dielectric 109 and over heat spreader 112, and is adjacent to the sides of heating element 116. Thermally resistive material 110 extends along the width of RF switch 100, and is also coplanar with heating element 116. In various implementations, thermally resistive material 110 can have a relative width and/or a relative thickness greater or less than shown FIG. 1. Thermally resistive material 110 can comprise any material with thermal resistivity lower than that of thermally conductive and electrically insulating material 118. In various implementations, thermally resistive material 110 can comprise $SiO_2$, $Si_XN_Y$, or another dielectric.

Heat valve 114 is situated between heating element 116 and heat spreader 112. In the present implementation, heat valve 114 is a segment of thermally resistive material 110. Because RF switch 100 includes heat valve 114 under heating element 116, vertical heat dissipation from heating element 116 is heavily biased toward active segment 122 of PCM 120, rather than toward heat spreader 112. Thus, active segment 122 of PCM 120 can reach higher temperatures for the same applied pulse power. In one implementation, the thickness of heat valve 114 is approximately two hundred angstroms (200 Å). In one implementation, rather than RF switch 100 including heat valve 114 as a segment of thermally resistive material 110, RF switch 100 can include heat valve 114 distinct from thermally resistive material 110. For example, RF switch 100 can include a liner around heating element 116 that performs as heat valve 114. As another example, RF switch 100 can include another thermally resistive material under heating element 116 having a width substantially matching a width of heating element 116. In one implementation, heat valve 114 can be omitted, and heating element 116 can be situated on heat spreader 112.

Heating element 116 is situated in thermally resistive material 110. Heating element 116 also underlies active segment 122 of PCM 120. Heating element 116 generates a crystallizing heat pulse or an amorphizing heat pulse for transforming active segment 122 of PCM 120. Heating element 116 can comprise any material capable of Joule heating. Preferably, heating element 116 comprises a material that exhibits minimal or substantially no electromigration, thermal stress migration, and/or agglomeration. In various implementations, heating element 116 can comprise tungsten (W), molybdenum (Mo), titanium (Ti), titanium nitride (TiN), titanium tungsten (TiW), tantalum (Ta), tantalum nitride (TaN), nickel chromium (NiCr), or nickel chromium silicon (NiCrSi). For example, in one implementation, heating element 116 comprises tungsten lined with titanium and titanium nitride. Heating element 116 may be formed by a damascene process, a subtractive etch process, or any other suitable process. Heating element 116 can be connected to electrodes of a pulse generator (not shown in FIG. 1) that generates a crystallizing current pulse or an amorphizing voltage or current pulses.

Thermally conductive and electrically insulating material 118 in FIG. 1 is a sheet situated on top of heating element 116 and thermally resistive material 110, and under PCM 120 and, in particular, under active segment 122 of PCM 120. Thermally conductive and electrically insulating material 118 ensures efficient heat transfer from heating element 116 toward active segment 122 of PCM 120, while electrically insulating heating element 116 from input/output contacts 130, PCM 120, and other neighboring structures. Thermally conductive and electrically insulating material 118 can comprise any material with high thermal conductivity and high electrical resistivity. In various implementations, thermally conductive and electrically insulating material 118 can comprise AlN, $Al_XO_Y$, $Be_XO_Y$, SiC, diamond, or diamond-like carbon.

PCM 120 is situated on top of thermally conductive and electrically insulating material 118. PCM 120 also overlies heating element 116. PCM 120 includes active segment 122 and passive segments 124. Active segment 122 of PCM 120 approximately overlies heating element 116 and is approximately defined by heating element 116. Passive segments 124 of PCM 120 extend outward and are transverse to heating element 116, and are situated approximately under input/output contacts 130. As used herein, "active segment" refers to a segment of PCM that transforms between crystalline and amorphous states, for example, in response to a crystallizing or an amorphizing heat pulse generated by heating element 116, whereas "passive segment" refers to a segment of PCM that does not make such transformation and maintains a crystalline state (i.e., maintains a conductive state). With proper heat pulses and heat dissipation, active segment 122 of PCM 120 can transform between crystalline and amorphous states, allowing RF switch 100 to switch between ON and OFF states respectively.

PCM 120 can be germanium telluride ($Ge_XTe_Y$), germanium antimony telluride ($Ge_XSb_YTe_Z$), germanium selenide ($Ge_XSe_Y$), or any other chalcogenide. In various implementations, PCM 120 can be germanium telluride having from forty percent to sixty percent germanium by composition (i.e., $Ge_XTe_Y$, where $0.4 \leq X \leq 0.6$ and $Y=1-X$). The material for PCM 120 can be chosen based upon ON state resistivity, OFF state electric field breakdown threshold, crystallization temperature, melting temperature, or other considerations. PCM 120 can be provided, for example, by physical vapor deposition (PVD), sputtering, chemical vapor deposition (CVD), evaporation, ion beam deposition (IBD), or atomic layer deposition (ALD). It is noted that in FIG. 1, current flowing in heating element 116 flows substantially under active segment 122 of PCM 120.

Optional contact uniformity support layer 126 is situated over PCM 120. In one implementation, optional contact uniformity support layer 126 comprises $Si_XN_Y$. In another implementation, optional contact uniformity support layer 126 is a bi-layer that comprises oxide and nitride, such as $SiO_2$ under $Si_XN_Y$. Optional contact uniformity support layer 126 can be provided, for example, by plasma enhanced CVD (PECVD) or high density plasma CVD (HDP-CVD).

Contact dielectric 128 is situated over optional contact uniformity support layer 126 and over thermally conductive and electrically insulating material 118. In various implementations, contact dielectric 128 is $SiO_2$, boron-doped $SiO_2$, phosphorous-doped $SiO_2$, $Si_XN_Y$, or another dielectric. In various implementations, contact dielectric 128 is a low-k dielectric, such as fluorinated silicon dioxide, carbon-doped silicon oxide, or spin-on organic polymer. Contact dielectric 128 can be provided, for example, by PECVD, HDP, or spin-on processes.

Input/output contacts 130 extend through contact dielectric 128 and through optional contact uniformity support layer 126 (in case optional contact uniformity support layer 126 is used), and connect to passive segments 124 of PCM 120. Input/output contacts 130 provide RF signals to/from PCM 120. In various implementations, Input/output contacts 130 can comprise tungsten (W), aluminum (Al), or copper (Cu).

In the present implementation, forming input/output contacts 130 of RF switch 100 may comprise two different etching actions. In the first etching action, contact dielectric 128 can be aggressively etched without having to accurately time the etching action. This etching action can use a selective etch, for example, a fluorine-based plasma dry etch, and optional contact uniformity support layer 126 can perform as an etch stop while contact dielectric 128 is selectively etched.

In the second etching action, optional contact uniformity support layer 126 is punch-through etched. As used herein, "punch-through" refers to a short etching action that can be accurately timed to stop at the top surface of PCM 120. In RF switch 100, input/output contacts 130 are narrow and optional contact uniformity support layer 126 is thin. Thus, only a small volume of optional contact uniformity support layer 126 is etched, and the punch-through etching action is short and can be accurately timed. In one implementation, a chlorine-based plasma dry etch is used for this etching action.

Optional contact uniformity support layer 126 is optional iii that the inventive concepts of the present application may be implemented without optional contact uniformity support layer 126. For example, input output contacts 130 can extend partially through contact dielectric 128, and be ohmically separated from and capacitively coupled to passive segments 124 of PCM 120. As another example, input/output contacts 130 can extend through contact dielectric 128 into PCM 120. Because the ON state resistance ($R_{ON}$) of RF switch 100 depends heavily on the uniformity of contact made between input/output contacts 130 and PCM 120, the $R_{ON}$ can be significantly lower when optional contact uniformity support layer 126 is used.

Because RF switch 100 includes thermally resistive material 110 on the sides of heating element 116, less heat transfers horizontally (i.e., from the sides) and more heat dissipates vertically, from heating element. 116 both toward active segment 122 of PCM 120 and toward heat spreader 112. Because RF switch 100 includes heat valve 114 between heating element 116 and heat spreader 112, vertical heat dissipation from heating element 116 is heavily biased toward active segment 122 of PCM 120, rather than toward heat spreader 112. Notably, in RF switch 100, heat spreader 112 is situated above multiple metallization layers as shown in the semiconductor structure of FIG. 1. As described above, in one implementation, the thermal conductivity of heat spreader 112 can range from approximately thirty five watts per meter-kelvin to approximately fifty watts per meter-kelvin (35 W/(m·K)–120 W/(m·K)).

Figure 2A:
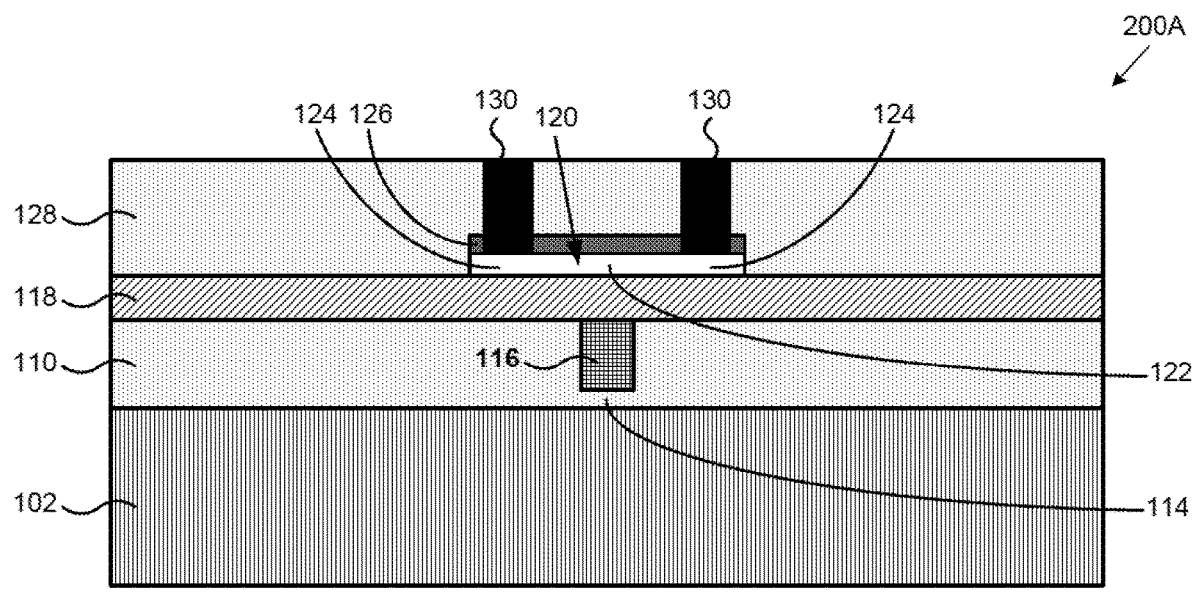
FIG. 2A illustrates a portion of an exemplary PCM RF switch according to one implementation of the present application.

FIG. 2A illustrates a portion of an exemplary PCM RF switch according to one implementation of the present application. As illustrated in FIG. 2A, RF switch 200A includes bulk substrate 102, thermally resistive material 110, heat valve 114, heating element 116, thermally conductive and electrically insulating material 118, PCM 120 having active segment 122 and passive segments 124 optional contact uniformity support layer 126, contact dielectric 128, and input/output contacts 130.

RF switch 200A in FIG. 2A is similar to RF switch 100 in FIG. 1, except that RF switch 200A in FIG. 2A is not built on a structure that includes multi-level metallization and, further, RF switch 200A does not include heat spreader 112. In RF switch 200A, bulk substrate 102 performs as a heat spreader. Bulk substrate 102 can comprise Si, Ge, silicon SiGe, SiC, group III-V, sapphire, or any bulk substrate material with high thermal conductivity. In RF switch 200A, bulk substrate 102 dissipates excess heat generated by heating element 116 after a heat pulse, such as a crystallizing pulse or an amorphizing pulse, has transformed the state of RF switch 200A to an ON state or an OFF state. In one implementation, in order for bulk substrate 102 to effectively dissipate heat generated by heating element 116, the thickness of heat valve 114 can be less than or approximately two thousand angstroms (2000 Å).

RF switch 100 in FIG. 1 allows versatility from a manufacturing standpoint, because heat spreader 112 and heating element 116 can be situated in any layer in a multi-level metallization. In contrast, RF switch 200A in FIG. 2A utilizing bulk substrate 102 as a heat spreader requires heating element 116 to be situated in a bottom layer. RF switch 200A also requires allocation of a portion of the surface area of bulk substrate 102 for heat spreading, which reduces the total surface area available for various semiconductor devices, such as transistors. However, RF switch 200A in FIG. 2A is able to provide several advantages. First, because heating element 116 is situated in a bottom layer, RF switch 200A can be built before any metallization layers. Multi-level metallization processes are typically subject to low temperature requirements. For example, a multi-level metallization process may be required to stay below four hundred and fifty degrees Celsius (<450° C.). Because RF switch 200A is built prior to manufacturing metallization layers, RF switch 200A can be built utilizing higher temperature processes and anneals typically unavailable for RF switch 100 which is built after manufacturing metallization layers. Examples of these processes include silicon oxidations, oxide depositions, or nitride depositions using furnaces operating in a range from approximately six hundred degrees Celsius to approximately one thousand degrees Celsius (600° C.-1000° C.), which can increase the quality of dielectric, material.

Second, bulk substrate 102 in FIG. 2A is generally better at transferring heat. In particular, heat generally transfers faster in monocrystalline materials than in amorphous materials. For example, heat spreader 112 in FIG. 1 can be amorphous AlN, and its thermal conductivity can range from approximately thirty five watts per meter-kelvin to approximately fifty watts per meter-kelvin (35 W/(m·K)-120 W/(m·K)). In contrast, in one implementation, bulk substrate 102 in FIG. 2A can be monocrystalline Si, and its thermal conductivity can be approximately one hundred seventy watts per meter-kelvin (170 W/(m·K)). Bulk substrate 102 in FIG. 2A also has larger mass, which dissipates heat more efficiently. Additionally, because bulk substrate 102 in FIG. 2A is situated on the bottom of RF switch 200A, when RF switch 200A is mounted on a printed circuit board (PCB) (not shown in FIG. 2A), bulk substrate 102 can further dissipate heat utilizing the PCB.

Third, the increased heat dissipation toward bulk substrate 102 in FIG. 2A is particularly useful to counteract the fact that heat valve 114 under heating element 116 slightly reduces heat dissipation toward bulk substrate 102. Thus, while heat dissipation is heavily biased toward active segment 122 of PCM 120, enabling active segment 122 of PCM 120 to reach higher temperatures for the same applied pulse power, bulk substrate 102 also cools heating element 116 and active segment 122 of PCM 120 more quickly. The quicker cooling is important for transforming active segment 122 of PCM 120. For example, in order to transform into an amorphous state, active segment 122 of PCM 120 may need to achieve temperatures of approximately seven hundred degrees Celsius (700° C.) or more, and may need to cool down within hundreds of nanoseconds.

Fourth, the quicker cooling of active segment. 122 of PCM 120 allows more area to be transformed, creating a wider active segment 122. A wider active segment 122 improves RF performance of RF switch 200A by increasing its breakdown voltage and linearity. In one implementation, the breakdown voltage of RF switch 200A in FIG. 2A can be twice the breakdown voltage of RF switch 100 in FIG. 1, and linearity of RF switch 200A in FIG. 2A can be ten decibels (10 dB) better than that of RF switch 100 in FIG. 1.

Figure 2B:
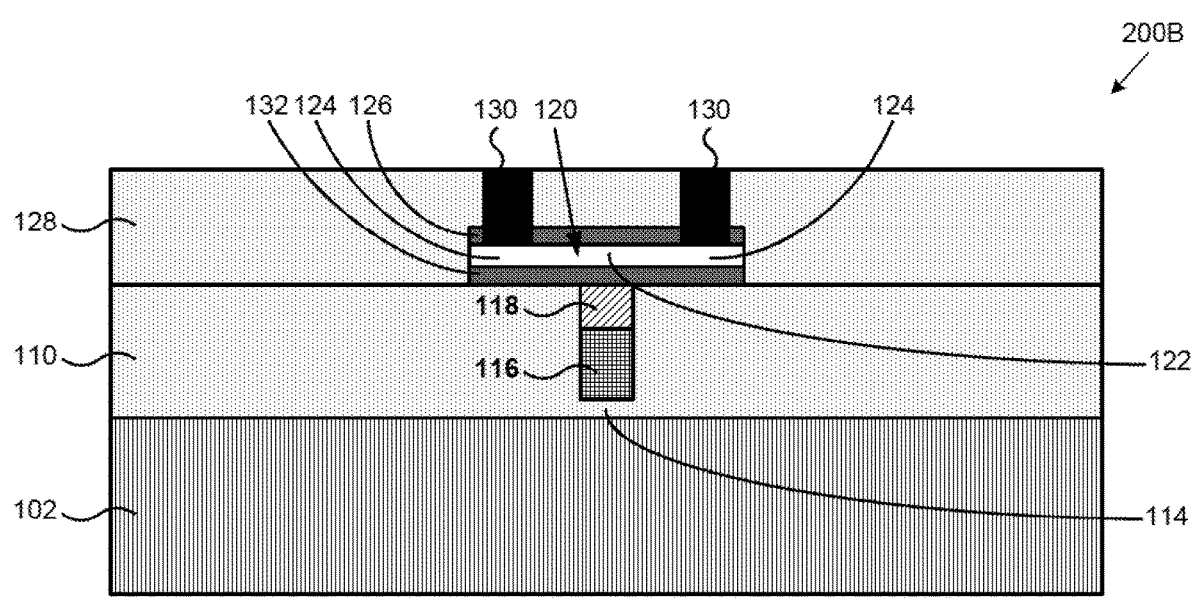
FIG. 2B illustrates a portion of an exemplary PCM RF switch according to one implementation of the present application.

FIG. 2B illustrates a portion of an exemplary PCM RF switch according to one implementation of the present application. As illustrated in FIG. 2B, RF switch 200B includes bulk substrate 102, thermally resistive material 110, heat valve 114, heating element 116, thermally conductive and electrically insulating material 118, PCM 120 having active segment 122 and passive segments 124, optional contact uniformity support layer 126, contact dielectric 128, input/output contacts 130, and optional conformability support layer 132.

RF switch 200B in FIG. 2B is similar to RF switch 200A in FIG. 2A, except that in RF switch 200B in FIG. 2B, thermally conductive and electrically insulating material 118 is a nugget and does not extend along the width of RF switch 200B, and conformability support layer 132 is situated under PCM 120. Thermally resistive material 110 is adjacent to sides of thermally conductive and electrically insulating material 118, and is substantially coplanar with the top of thermally conductive and electrically insulating material 118. Passive segments 124 of PCM 120 are situated approximately over thermally resistive material 110, while active segment 122 of PCM 120 is situated approximately over thermally conductive and electrically insulating material 118. In the present implementation, thermally conductive and electrically insulating material 118 is aligned with heating element 116. In various implementations, thermally conductive and electrically insulating material 118 can be wider or narrower than shown in FIG. 2B.

RF switch 200B in FIG. 2B dissipates significantly less heat towards passive segments 124 of PCM 120 and input/output contacts 130 as compared to RF switch 200A in FIG. 2A. Because RF switch 200B includes thermally resistive material 110 adjacent to sides of thermally conductive and electrically insulating material 118, more heat dissipates vertically from heating element 116 toward active segment 122 of PCM 120. Thus, active segment 122 of PCM 120 can reach even higher temperatures for the same applied pulse power. Further, RF switch 200B significantly reduces heating of passive segments 124 of PCM 120 and input/output contacts 130 overlying thermally resistive material 110, since unlike RF switch 200A of FIG. 2A, passive segments 124 are not entirely situated directly over thermally conductive and electrically insulating material 118. Thus, it is less necessary to increase the width of PCM 120 and space input/output contacts 130 farther from heating element 116 (which could detrimentally increase $R_{ON}$) in order to reduce thermal cycling consequences to these structures.

RF switch 200B in FIG. 2B also includes optional conformability support layer 132 under PCM 120. Optional conformability support layer 132 avoids non-conformities in PCM 120 that would otherwise occur when PCM 120 is situated over a non-homogeneous surface. By using optional conformability support layer 132, PCM 812 is situated over a homogenous surface, thereby allowing PCM 120 to be substantially uniform with respect to that surface. If optional conformability support layer 132 under PCM 120 were not used, PCM 120 would be situated over a non-homogeneous surface of thermally conductive and electrically insulating material 118 and thermally resistive material 110, and non-conformities in PCM 120 are likely to occur, particularly around interfaces of thermally conductive and electrically insulating material 118 and thermally resistive material 110. In various implementations, optional conformability support layer 132 is $Si_xN_y$ or $SiO_2$. In one implementation, optional conformability support layer 132 can have a thickness of approximately fifty angstroms to approximately five hundred angstroms (50 Å-500 Å). The added thickness of optional conformability support layer 132 also reduces parasitic capacitance between heating element 116 and input/output contacts 130, PCM 120, and other neighboring structures.

RF switch 200B in FIG. 2B is similar to RF switch 200A in FIG. 2A in that RF switch 200B in FIG. 2B also utilizes bulk substrate 102 as a heat spreader. Accordingly, RF switch 200B in FIG. 2B may have any implementations and advantages described above.

Figure 3A:
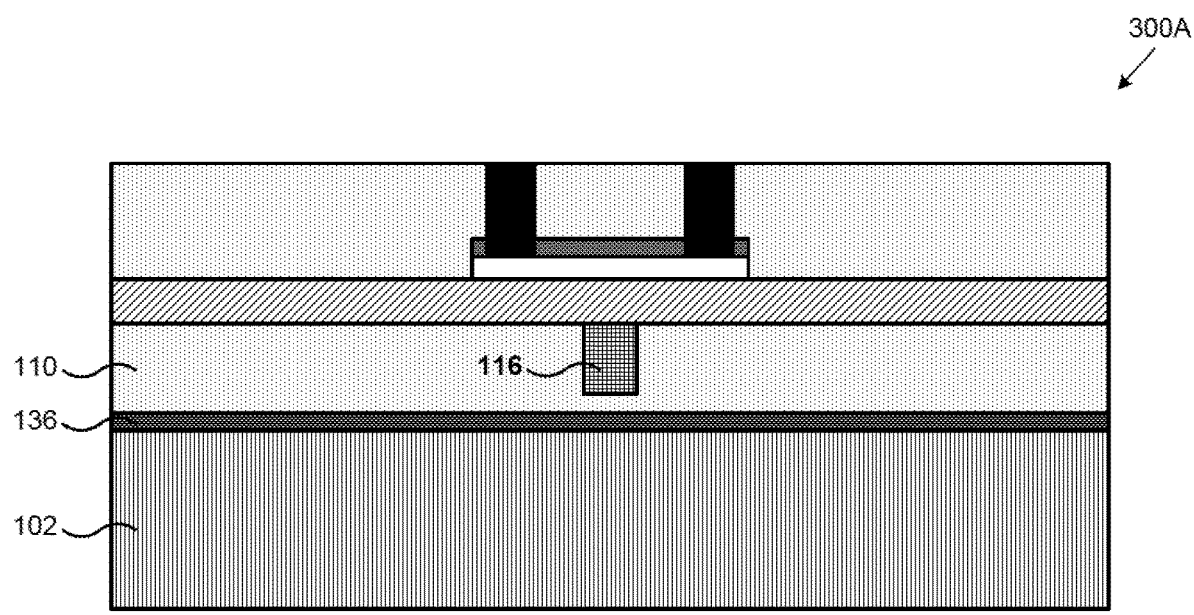
FIG. 3A illustrates a portion of an exemplary PCM RF switch according to one implementation of the present application.

FIG. 3A illustrates a portion of an exemplary PCM RF switch according to one implementation of the present application. RF switch 300A in FIG. 3A is similar to RF switch 200A in FIG. 2A, except that RF switch 300A in FIG. 3A includes trap rich layer 136 situated between bulk substrate 102 and thermally resistive material 110. In various implementations, trap rich layer 136 is polycrystalline Si, amorphous Si, argon-implanted Si, or etched Si. Trap rich layer 136 reduces a parasitic conduction layer induced between bulk substrate 102 and thermally resistive material 110.

In RF switch 300A, trap rich layer 136 and bulk substrate 102 together perform as a heat spreader. Depending on the materials used for trap rich layer 136, trap rich layer 136 can correspondingly decrease thermal conductivity between heating element 116 and bulk substrate 102, compared to RF switch 200A in FIG. 2A utilizing bulk substrate 102 alone. However, compared to RF switch 100 in FIG. 1 utilizing heat spreader 112, RF switch 300A in FIG. 3A utilizing trap rich layer 136 and bulk substrate 102 still dissipates significantly more heat. Accordingly, RF switch 300A in FIG. 3A can provide any advantages described above with reference to RF switch 200A in FIG. 2A, while additionally reducing a parasitic conduction layer induced between bulk substrate 102 and thermally resistive material 110.

Figure 3B:
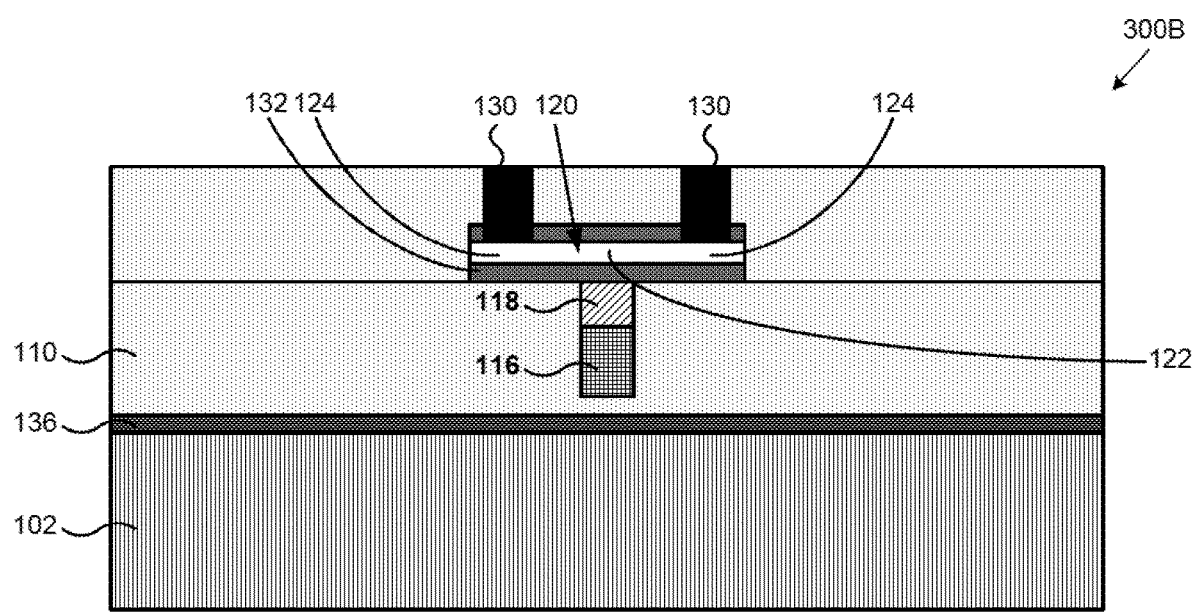
FIG. 3B illustrates a portion of an exemplary PCM RF switch according to one implementation of the present application.

FIG. 3B illustrates a portion of an exemplary PCM RF switch according to one implementation of the present application. RF switch 300B in FIG. 3B is similar to RF switch 300A in FIG. 3A, except that in RF switch 300B in FIG. 3B, thermally conductive and electrically insulating material 118 is a nugget and does not extend along the width of RF switch 300B, and conformability support layer 132 is situated under PCM 120. Thermally resistive material 110 is adjacent to sides of thermally conductive and electrically insulating material 118, and is substantially coplanar with the top of thermally conductive and electrically insulating material 118. Passive segments 124 of PCM 120 are situated approximately over thermally resistive material 110, while active segment 122 of PCM 120 is situated approximately over thermally conductive and electrically insulating material 118. In the present implementation, thermally conductive and electrically insulating material 118 is aligned with heating element 116. In various implementations, thermally conductive and electrically insulating material 118 can be wider or narrower than shown in FIG. 3B.

RF switch 300B in FIG. 3B dissipates significantly less heat towards passive segments 124 of PCM 120 and input/output contacts 130 as compared to RF switch 300A in FIG. 3A, and reduces thermal cycling consequences to these structures. RF switch 300B in FIG. 3B also includes optional conformability support layer 132 under PCM 120 in order to avoid non-conformities in PCM 120, and to reduce parasitic capacitance between heating element 116 and input/output contacts 130, PCM 120, and other neighboring structures.

Figure 4A:
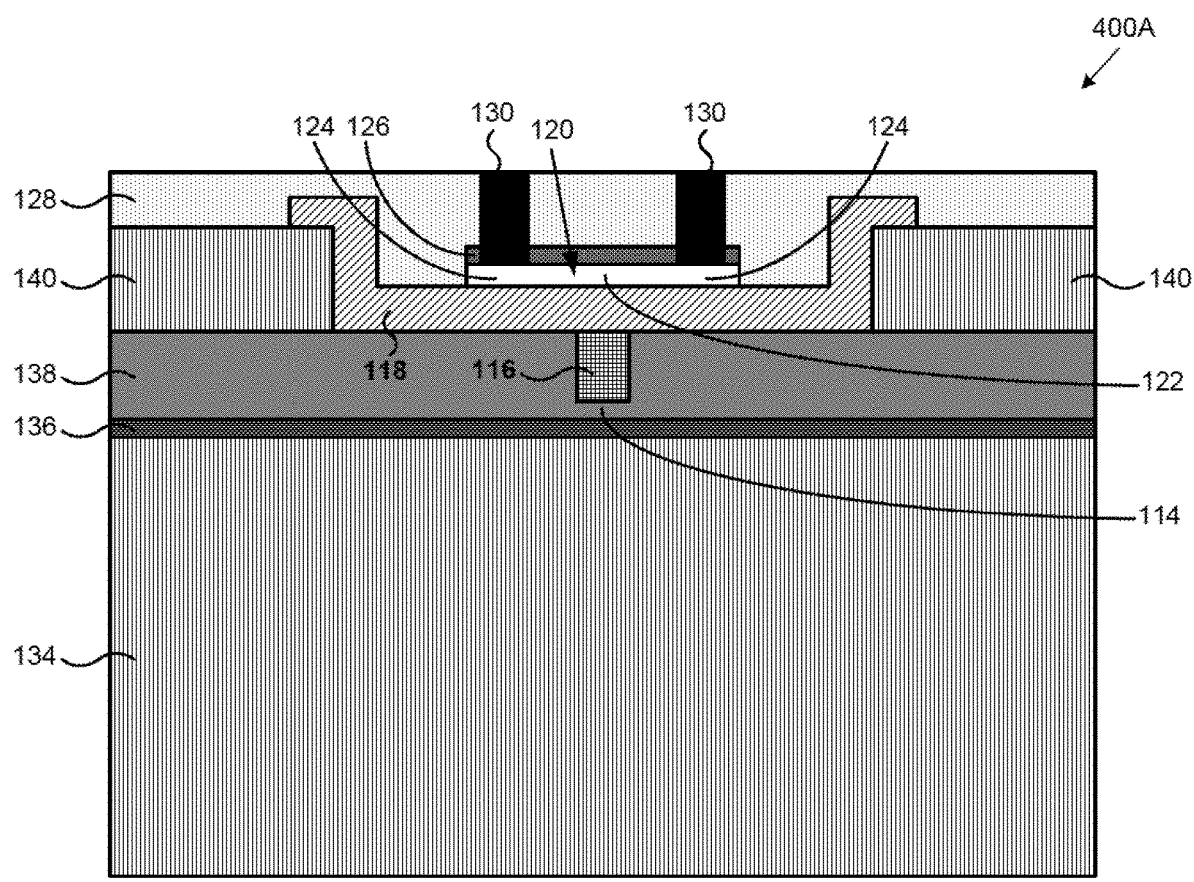
FIG. 4A illustrates a portion of an exemplary PCM RF switch according to one implementation of the present application.

FIG. 4A illustrates a portion of an exemplary PCM RF switch according to one implementation of the present application. As illustrated in FIG. 4A, RF switch 400A includes silicon-on-insulator (SOI) handle wafer 134, trap rich layer 136, SOI insulator 138, SOI top semiconductor 140, heat valve 114, heating element 116, thermally conductive and electrically insulating material 118, PCM 120 having active segment 122 and passive segments 124, optional contact uniformity support layer 126, contact dielectric 128, and input output contacts 130.

RF switch 400A in FIG. 4A is similar to RF switch 200A in FIG. 2A, except that RF switch 400A in FIG. 4A utilizes an SOI substrate instead of a bulk substrate, such as bulk substrate 102 in FIG. 2A. In manufacturing RF switch 400A, a bonded and etch back SOI (BESOI) process can be used, as known in the art. In a BESOI process, SOI handle wafer 134, trap rich layer 136, SOI insulator 138, and SOI top semiconductor 140 together form an SOI substrate. In one implementation, SOI handle wafer 134 is undoped Si. In various implementations, trap rich layer 136 is polycrystalline Si, amorphous Si, argon-implanted Si, or etched Si. Trap rich layer 136 reduces a parasitic conduction layer induced between SOI handle wafer 134 and SOI insulator 138. In various implementations, SOI insulator 138 typically comprises $SiO_2$, but it may also comprise $Si_xN_y$, or another insulator material. In one implementation, SOI top semiconductor 140 is doped Si. Other devices (not shown in FIG. 4A) can be integrated in SOI top semiconductor 140. SOI handle wafer 134, trap rich layer 136, SOI insulator 138, and SOI top semiconductor 140 can be provided together as a pre-fabricated SOI substrate. By utilizing an SOI substrate, RF switch 400A improves linearity and decreases parasitic capacitances and other RF losses.

As shown in FIG. 4A, part of SOI top semiconductor 140 is removed, and part of SOI insulator 138 is exposed. Heating element 116 is situated in SOI insulator 138. Heating element 116 can be formed in SOI insulator 138, for example, using a damascene process. Thermally conductive and electrically insulating material 118 is situated in and partially over SOI top semiconductor 140, above heating element 116 and on the exposed portion of SOI insulator 138. PCM 120 having active segment 122 and passive segments 124, optional contact uniformity support layer 126, contact dielectric 128, and input/output contacts 130 are formed over thermally conductive and electrically insulating material 118, in a manner described above.

In RF switch 400A, trap rich layer 136 and SOI handle wafer 134 together perform as a heat spreader. Trap rich layer 136 and SOI handle wafer 134 dissipate excess heat generated by heating element 116 after a heat pulse, such as a crystallizing pulse or an amorphizing pulse, has transformed the state of RF switch 400A to an ON state or an OFF state. SOI insulator 138 is adjacent to sides of heating element 116, and SOI insulator 138 performs as thermally resistive material to dissipate heat vertically from heating element 116 both toward active segment 122 of PCM 120 and toward SOI handle wafer 134. Heat valve 114 is a segment of SOI insulator 138 situated between heating element 116 and SOI handle wafer 134 to bias heat dissipation toward active segment 122 of PCM 120, rather than toward SOI handle wafer 134.

RF switch 400A in FIG. 4A utilizing trap rich layer 136 and SOI handle wafer 134 as a heat spreader is able to provide several advantages. RF switch 400A can utilize high temperature processes and anneals typically unavailable after multi-level metallization. SOI handle wafer 134 in FIG. 4A efficiently dissipates heat, and cools heating element 116 and active segment 122 of PCM 120 quickly, even though heat valve 114 under heating element 116 biases heat dissipation away from SOI handle wafer 134. Utilizing SOI handle wafer 134 as a heat spreader also allows for a wider active segment 122, increasing the breakdown voltage and linearity of RF switch 400A.

Additionally, because RF switch 400A utilizes an SOI substrate, RF switch 400A further improves linearity and decreases parasitic capacitances and other RF losses. Notably, while trap rich layer 136 reduces a parasitic conduction layer induced between SOI handle wafer 134 and SOI insulator 138, depending on the materials used for trap rich layer 136, it can correspondingly decrease thermal conductivity between heating element 116 and SOI handle wafer 134. In one implementation, RF switch 400A does not include trap rich layer 136.

Figure 4B:
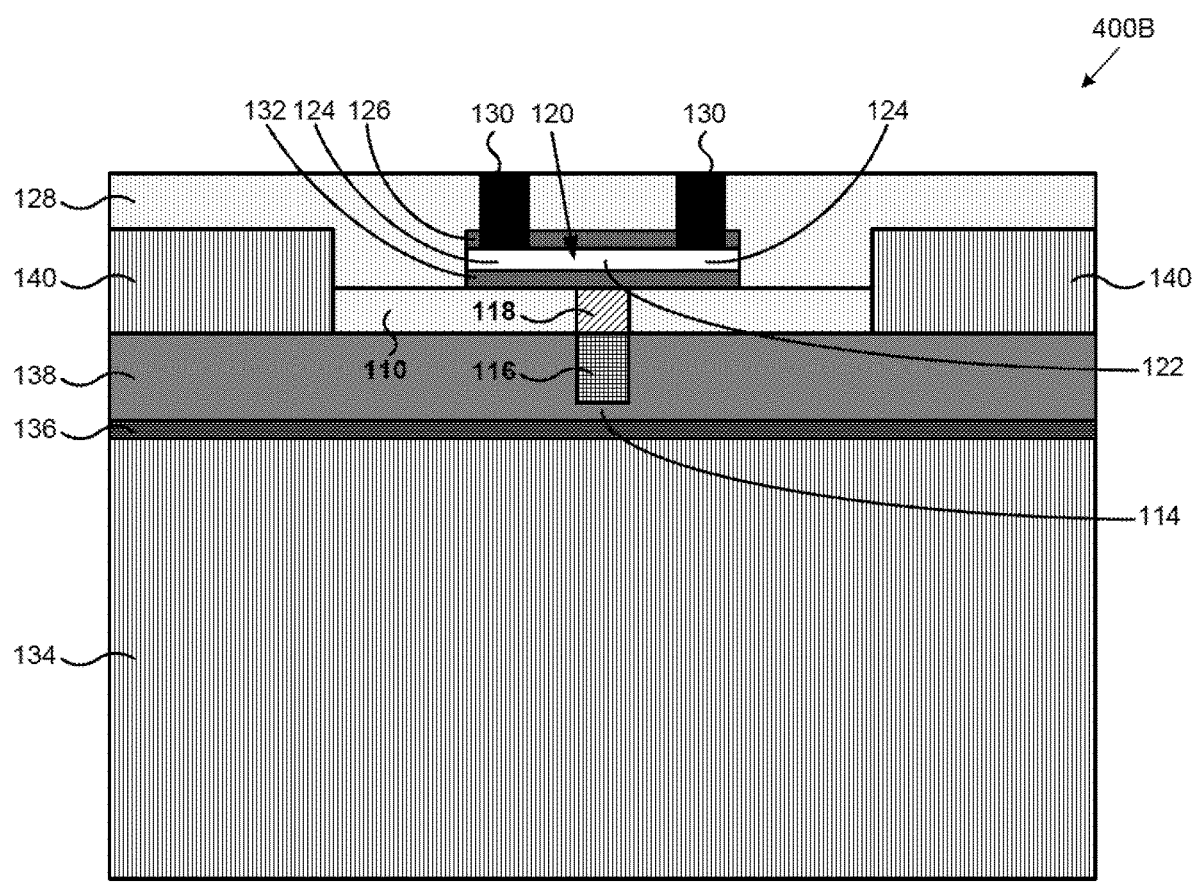
FIG. 4B illustrates a portion of an exemplary PCM RF switch according to one implementation of the present application.

FIG. 4B illustrates a portion of an exemplary PCM RF switch according to one implementation of the present application. As illustrated in FIG. 4B, RF switch 400B includes SOI handle wafer 134, trap rich layer 136, SOI insulator 138, SOI top semiconductor 140, thermally resistive material 110, heat valve 114, heating element 116, thermally conductive and electrically insulating material 118, PCM 120 having active segment 122 and passive segments 124, optional contact uniformity support layer 126, contact dielectric 128, input/output contacts 130, and optional conformability support layer 132.

RF switch 400B in FIG. 4B is similar to RF switch 400A in FIG. 4A, except that in RF switch 400B in FIG. 4B, thermally conductive and electrically insulating material 118 is a nugget and does not extend over SOI insulator 138 or SOI top semiconductor 140. Thermally resistive material 110 is situated over SOI insulator 138 between parts SOI top semiconductor 140. Thermally resistive material 110 is adjacent to sides of thermally conductive and electrically insulating material 118, and is substantially coplanar with the top of thermally conductive and electrically insulating material 118. Passive segments 124 of PCM 120 are situated approximately over thermally resistive material 110, while active segment 122 of PCM 120 is situated approximately over thermally conductive and electrically insulating material 118.

RF switch 400B in FIG. 4B dissipates significantly less heat towards passive segments 124 of PCM 120 and input/output contacts 130 as compared to RF switch 400A in FIG. 4A, and reduces thermal cycling consequences to these structures. RF switch 400B in FIG. 4B also includes optional conformability support layer 132 under PCM 120 in order to avoid non-conformities in PCM 120, and to reduce parasitic capacitance between heating element 116 and input/output contacts 130, PCM 120, and other neighboring structures.

Figure 5A:
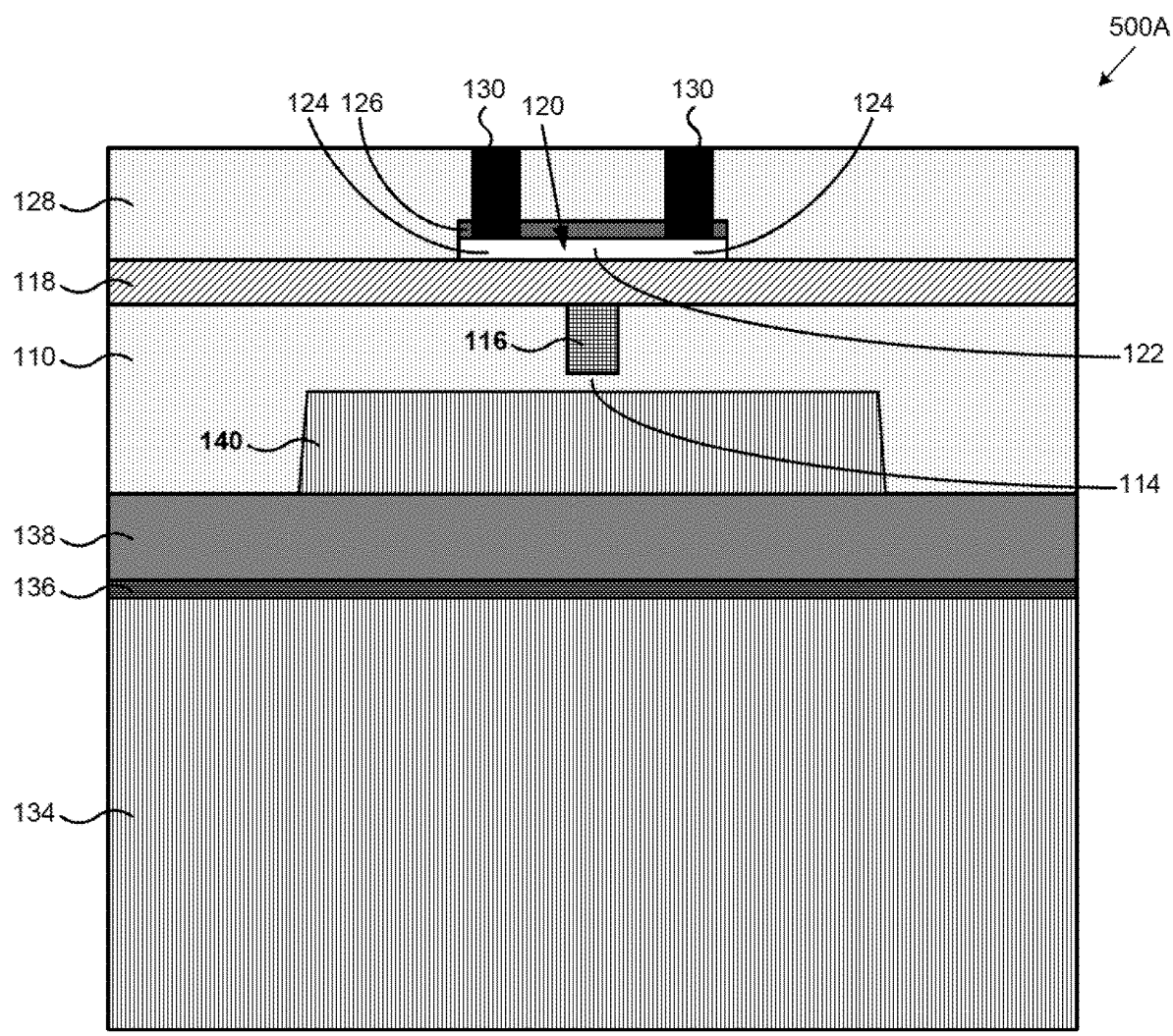
FIG. 5A illustrates a portion of an exemplary PCM RF switch according to one implementation of the present application.

FIG. 5A illustrates a portion of an exemplary PCM RF switch according to one implementation of the present application. As illustrated in FIG. 5A, RF switch 500A includes SOI handle wafer 134, trap rich layer 136, SOI insulator 138, SOI top semiconductor 140, thermally resistive material 110, heat valve 114, heating element 116, thermally conductive and electrically insulating material 118, PCM 120 having active segment 122 and passive segments 124, optional contact uniformity support layer 126, contact dielectric 128, and input/output contacts 130.

In manufacturing RF switch 500A, a bonded and etch back SOI (BESOI) process can be used, as known in the art. In a BESOI process, SOI handle wafer 134, trap rich layer 136, SOI insulator 138, and SOI top semiconductor 140 together form an SOI substrate. Alternatively, as also known in the art, a SIMOX process (separation by implantation of oxygen process) or a "smart cut" process can also be used for manufacturing RF switch 500A. In a SIMOX process, SOI handle wafer 134 can be a bulk silicon support wafer (which for ease of reference, may still be referred to as a "SOI handle wafer" in the present application). Similar to a BESOI process, in both SIMOX and smart cut processes, SOI handle wafer 134, trap rich layer 136, SOI insulator 138, and SOI top semiconductor 140 together form an SOI substrate.

RF switch 500A in FIG. 5A is similar to RF switch 400A in FIG. 4A, except that RF switch 500A in FIG. 5A does not utilize trap rich layer 136 and SOI handle wafer 134 (or SOI bulk silicon support wafer 134) as a heat spreader. Rather, SOI top semiconductor 140 performs as a heat spreader. SOI top semiconductor 140 dissipates excess heat generated by heating element 116 after a heat pulse, such as a crystallizing pulse or an amorphizing pulse, has transformed the state of RF switch 500A to an ON state or an OFF state. In the present implementation, SOI top semiconductor 140 performing as a heat spreader for RF switch 500A is patterned in order to be isolated from other devices (not shown in FIG. 5A) integrated in other parts of SOI top semiconductor 140. In another implementation, SOI top semiconductor 140 can extend along the width of RF switch 500A. RF switch 500A includes thermally resistive material 110 above SOI top semiconductor 140, and heating element 116 is situated in thermally resistive material 110, rather than in SOI insulator 138. Thermally conductive and electrically insulating material 118 is situated over thermally resistive material 110 and heating element 116. PCM 120 having active segment 122 and passive segments 124, optional contact uniformity support layer 126, contact dielectric 128 and input/output contacts 130 are formed over thermally conductive and electrically insulating material 118, as described above.

RF switch 500A can utilize high temperature processes and anneals typically unavailable after multi-level metallization. SOI top semiconductor 140 in FIG. 5A efficiently dissipates heat, and cools heating element 116 and active segment 122 of PCM 120 quickly, even though heat valve 114 under heating element 116 biases heat dissipation away from SOI top semiconductor 140. Utilizing SOI top semiconductor 140 as a heat spreader also allows for a wider active segment 122, increasing the breakdown voltage and linearity of RF switch 500A. Additionally, because RF switch 500A utilizes an SOI substrate, RF switch 500A further improves linearity and decreases parasitic capacitances and other RF losses.

SOI top semiconductor 140 is silificantly thinner than SOI handle wafer 134. Thus, RF switch 500A in FIG. 5A utilizing SOI top semiconductor 140 as a heat spreader dissipates less heat compared to RF switch 400A in FIG. 4A utilizing SOI handle wafer 134 as a heat spreader. When SOI top semiconductor 140 in RF switch 500A in FIG. 5A is doped, and SOI handle wafer 134 in RF switch 400A in FIG. 4A is undoped, RF switch 500A in FIG. 5A utilizing SOI top semiconductor 140 as a heat spreader dissipates even less heat. However, compared to RF switch 100 in FIG. 1 utilizing heat spreader 112, RF switch 500A in FIG. 5A utilizing SOI top semiconductor 140 still dissipates significantly more heat. Additionally, RF switch 500A in FIG. 5A provides several advantages over RF switch 400A in FIG. 4A.

First, trap rich layer 136 in RF switch 400A in FIG. 4A can reduce heat dissipation from heating element 116 to SOI handle wafer 134, decreasing thermal performance. Because trap rich layer 136 in RF switch 500A in FIG. 5A does not intervene between heating element 116 and SOI top semiconductor 140, trap rich layer 136 reduces a parasitic conduction layer induced between SOI handle wafer 134 and SOI insulator 138, without trading off thermal performance.

Second, the dimensions of heating element 116 in RF switch 400A in FIG. 4A are constrained by the dimensions of SOI insulator 138. Because heating element 116 in RF switch 400A in FIG. 4A is situated in 501 insulator 138, heating element 116 must be thinner than SOI insulator 138, or a more complex fabrication process must be used. Where SOI insulator 138 is thin and part of a pre-fabricated SOI substrate, these dimensional constraints can be especially consequential. Because heating element 116 in RF switch 500A in FIG. 5A is situated in thermally resistive material 110 above the SOI substrate rather than in SOI insulator 138, heating element 116 is not constrained by the dimensions of SOI insulator 138.

Third, manufacturing RF switch 500A in FIG. 5A is generally simpler than manufacturing RF switch 400A in FIG. 4A. Because heating element 116 in RF switch 500A in FIG. 5A is situated in thermally resistive material 110 above the SOI substrate, rather than in SOI insulator 138, no parts of SOI top semiconductor 140 and SOI insulator 138 have to be patterned and removed in order to form heating element 116. A pre-fabricated SOI substrate can be left substantially undisturbed, and heating element 116 and overlying structures can simply be formed thereover.

Figure 5B:
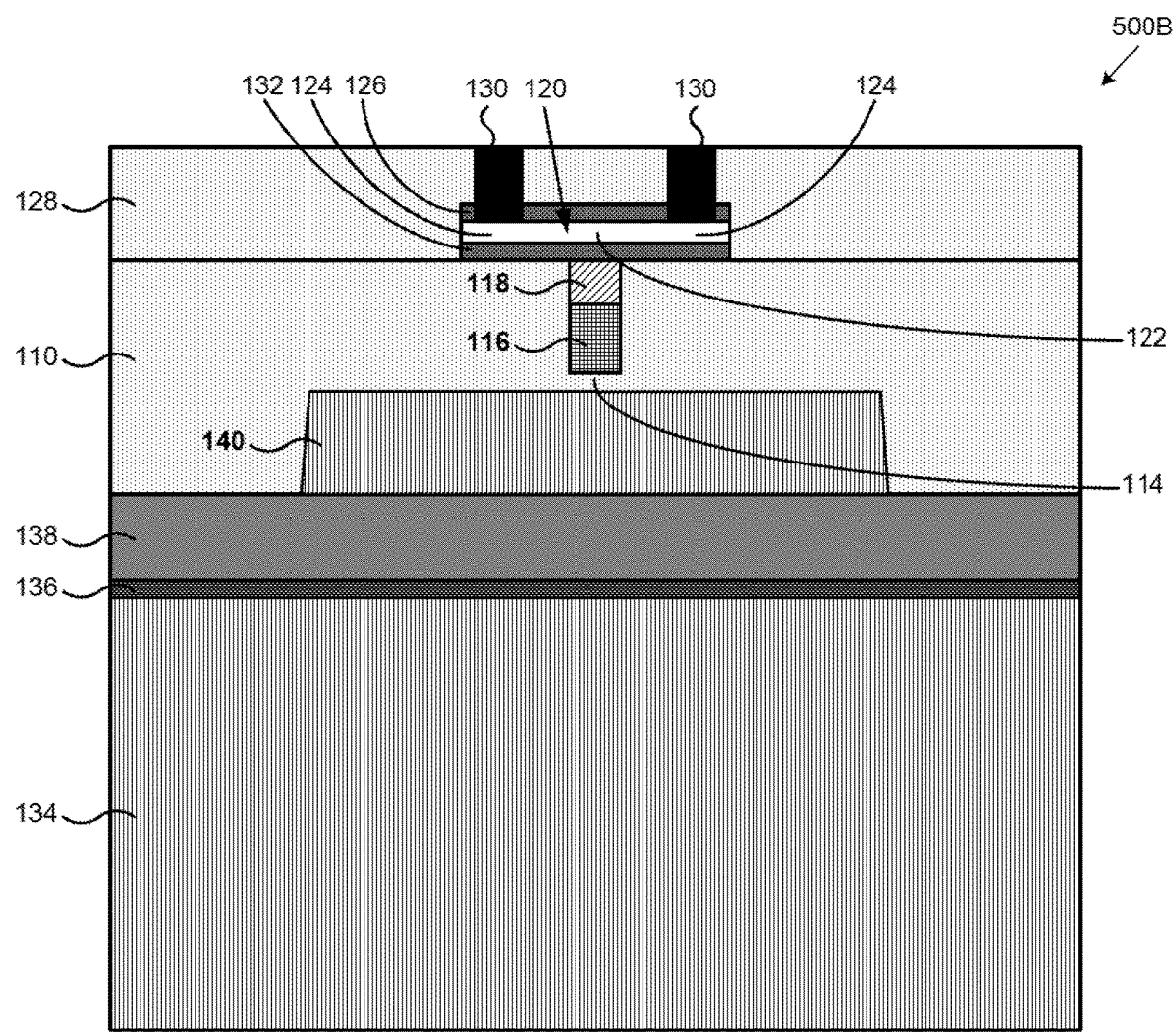
FIG. 5B illustrates a portion of an exemplary PCM RF switch according to one implementation of the present application.

FIG. 5B illustrates a portion of an exemplary PCM RF switch according to one implementation of the present application. As illustrated in FIG. 5B, RF switch 500B includes SOI handle wafer 134 trap rich layer 136, SOI insulator 138, SOI top semiconductor 140, thermally resistive aerial 110, heat valve 114, heating element 116, thermally conductive and electrically insulating material 118, PCM 120 having active segment 122 and passive segments 124, optional contact uniformity support layer 126, contact dielectric 128, input/output contacts 130, and optional conformability support layer 132.

RF switch 500B in FIG. 5B is similar to RF switch 500A in FIG. 5A, except that in RF switch 500B in FIG. 5B, thermally conductive and electrically insulating material 118 is a nugget and does not extend over thermally resistive material 110. Thermally resistive material 110 is adjacent to sides of thermally conductive and electrically insulating material 118, and is substantially coplanar with the top of thermally conductive and electrically insulating material 118. Passive segments 124 of PCM 120 are situated approximately over thermally resistive material 110, while active segment 122 of PCM 120 is situated approximately over thermally conductive and electrically insulating material 118.

RF switch 500B in FIG. 5B dissipates significantly less heat towards passive segments 124 of PCM 120 and input/output contacts 130 as compared to RF switch 500A in FIG. 5A, and reduces thermal cycling consequences to these structures. RF switch 500B in FIG. 5B also includes optional conformability support layer 132 under PCM 120 in order to avoid non-conformities in PCM 120, and to reduce parasitic capacitance between heating element 116 and input/output contacts 130, PCM 120, and other neighboring structures.

Thus, various implementations of the present application achieve PCM RF switches having heat spreaders that overcome the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not a restrictive. It should also be understood that the present application is not limited to the particular implementations described above, but many rearrangements, modifications, and substitutions are possible without departing from the scope of the present disclosure.

The invention claimed is:

1. A radio frequency (RF) switch comprising:
   a heating element;
   a thermally resistive material adjacent to first and second sides of said heating element;
   a thermally conductive and electrically insulating material situated on top of said heating element;
   a phase-change material (PCM) situated over said thermally conductive and electrically insulating material, said PCM having an active segment overlying said heating element and passive segments underlying input/output contacts of said RF switch;
   a bulk substrate heat spreader under said heating element;
   a heat valve between said heating element and said bulk substrate heat spreader.

2. The RF switch of claim 1, wherein said heat valve is selected from the group consisting of silicon oxide ($SiO_2$) and silicon nitride ($Si_xN_y$).

3. The RF switch of claim 1, wherein said thermally conductive and electrically insulating material is a sheet of material selected from the group consisting of aluminum nitride (AlN), aluminum oxide ($Al_xO_y$), beryllium oxide ($Be_xO_y$), silicon carbide (SiC), silicon nitride ($Si_xN_y$), diamond, and diamond-like carbon.

4. The RF switch of claim 1, wherein said thermally conductive and electrically insulating material is a nugget of material selected from the group consisting of aluminum nitride (AlN), aluminum oxide ($Al_xO_y$), beryllium oxide ($Be_xO_y$), silicon carbide (SiC), silicon nitride ($Si_xN_y$), diamond, and diamond-like carbon.

5. The RF switch of claim 4, further comprising a conformability support layer over said nugget and said thermally resistive material, and under said PCM.

6. The RF switch of claim 1, wherein said heat valve is distinct from said thermally resistive material.

7. The RF switch of claim 6, wherein said heat valve comprises a liner around said heating element.

8. A radio frequency (RF) switch comprising:
   a heating element;
   a thermally resistive material adjacent to first and second sides of said heating element, wherein said thermally resistive material is an SOI insulator;
   a thermally conductive and electrically insulating material situated on top of said heating element;
   a phase-change material (PCM) situated over said thermally conductive and electrically insulating material, said PCM having an active segment overlying said heating element and passive segments underlying input/output contacts of said RF switch;
   an SOI handle wafer heat spreader under said heating element, wherein said SOI handle wafer heat spreader is configured to perform as a heat spreader for said heating element.

9. The RF switch of claim 8, wherein said thermally conductive and electrically insulating material is situated in an SOI top semiconductor.

10. The RF switch of claim 8, further comprising a heat valve between said heating element and said SOI handle wafer heat spreader.

11. The RF switch of claim 10, wherein said heat valve is selected from the group consisting of silicon oxide ($SiO_2$) and silicon nitride ($Si_xN_y$).

12. The RF switch of claim 10, wherein said heat valve is distinct from said thermally resistive material.

13. The RF switch of claim 12, wherein said heat valve comprises a liner around said heating element.

14. The RF switch of claim 8, wherein said thermally conductive and electrically insulating material is a sheet of material selected from the group consisting of aluminum nitride (AlN), aluminum oxide ($Al_xO_y$), beryllium oxide ($Be_xO_y$), silicon carbide (SiC), silicon nitride ($Si_xN_y$), diamond, and diamond-like carbon.

15. The RF switch of claim 8, wherein said thermally conductive and electrically insulating material is a nugget of material selected from the group consisting of aluminum nitride (AlN), aluminum oxide ($Al_xO_y$), beryllium oxide ($Be_XO_Y$), silicon carbide (SiC), silicon nitride ($Si_XN_Y$), diamond, and diamond-like carbon.

16. A radio frequency (RF) switch comprising:
a heating element;
a thermally resistive material adjacent to first and second sides of said heating element;
a thermally conductive and electrically insulating material situated on top of said heating element;
a phase-change material (PCM) situated over said thermally conductive and electrically insulating material, said PCM having an active segment overlying said heating element and passive segments underlying input/output contacts of said RF switch;
an SOI top semiconductor heat spreader under said heating element;
a heat valve between said heating element and said SOI top semiconductor heat spreader.

17. The RF switch of claim 16, wherein said heat valve is selected from the group consisting of silicon oxide ($SiO_2$) and silicon nitride ($Si_XN_Y$).

18. The RF switch of claim 16, wherein said thermally conductive and electrically insulating material is a sheet of material selected from the group consisting of aluminum nitride (AlN), aluminum oxide ($Al_XO_Y$), beryllium oxide ($Be_XO_Y$), silicon carbide (SiC), silicon nitride ($Si_XN_Y$), diamond, and diamond-like carbon.

19. The RF switch of claim 16, wherein said thermally conductive and electrically insulating material is a nugget of material selected from the group consisting of aluminum nitride (AlN), aluminum oxide ($Al_XO_Y$), beryllium oxide ($Be_XO_Y$), silicon carbide (SiC), silicon nitride ($Si_XN_Y$), diamond, and diamond-like carbon.

20. The RF switch of claim 16, wherein said heat valve is distinct from said thermally resistive material.

* * * * *